(12) United States Patent
Brahmbhatt et al.

(10) Patent No.: US 6,981,595 B2
(45) Date of Patent: Jan. 3, 2006

(54) CARRIER TAPE FOR ELECTRONIC COMPONENTS

(75) Inventors: Samuil Brahmbhatt, Chanhassen, MN (US); Ralph Henderer, Excelsior, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/428,328

(22) Filed: May 1, 2003

(65) Prior Publication Data

US 2004/0011700 A1 Jan. 22, 2004

Related U.S. Application Data

(60) Provisional application No. 60/377,537, filed on May 1, 2002.

(51) Int. Cl.
*B65D 73/02* (2006.01)

(52) U.S. Cl. .................................... 206/714; 206/725

(58) Field of Classification Search ................ 206/713, 206/714, 718, 722, 724, 725, 564
See application file for complete search history.

(56) References Cited

U.S. PATENT DOCUMENTS

| | | | |
|---|---|---|---|
| 4,681,221 A | | 7/1987 | Chickanosky et al. |
| 5,238,110 A | * | 8/1993 | Ye ............................. 206/714 |
| 5,791,486 A | | 8/1998 | Brahmbhatt |
| 6,102,210 A | | 8/2000 | Mikami |
| 6,168,026 B1 | | 1/2001 | Haggard et al. |
| 6,179,127 B1 | | 1/2001 | Kato et al. |
| 6,182,829 B1 | | 2/2001 | Clark et al. |
| 6,216,419 B1 | | 4/2001 | Sakurai |
| 6,729,474 B2 | * | 5/2004 | Hong et al. .................. 206/714 |
| 6,769,549 B2 | * | 8/2004 | Susaki ......................... 206/714 |
| 2002/0005370 A1 | | 1/2002 | Hatakeyama |
| 2002/0005371 A1 | | 1/2002 | Susaki |
| 2003/0196930 A1 | * | 10/2003 | Agari ........................... 206/714 |
| 2004/0011700 A1 | * | 1/2004 | Brahmbhatt et al. ......... 206/713 |

FOREIGN PATENT DOCUMENTS

| | | |
|---|---|---|
| JP | 11208769 A2 | 1/1998 |
| JP | 2001225864 A | 2/2000 |
| JP | 2000327025 A | 11/2000 |

* cited by examiner

*Primary Examiner*—Shian T. Luong
(74) *Attorney, Agent, or Firm*—Patterson, Thuente, Skaar & Christensen, PA

(57) ABSTRACT

A carrier tape for receiving, seating, storing and transporting components having an upper surface, a lower surface, four corners and four sidewalls. The tape includes a strip of material with a plurality of pockets. Each pocket includes a plurality of corner guides with angled engagement members for guiding, centering and supporting a component by its lower peripheral corner without any other contact between the component and the pocket. The pocket may include at least one support shelf positioned so as to contact a corner of the component upon misalignment of the component and thereby prevent further downward movement of the component in the pocket.

14 Claims, 5 Drawing Sheets

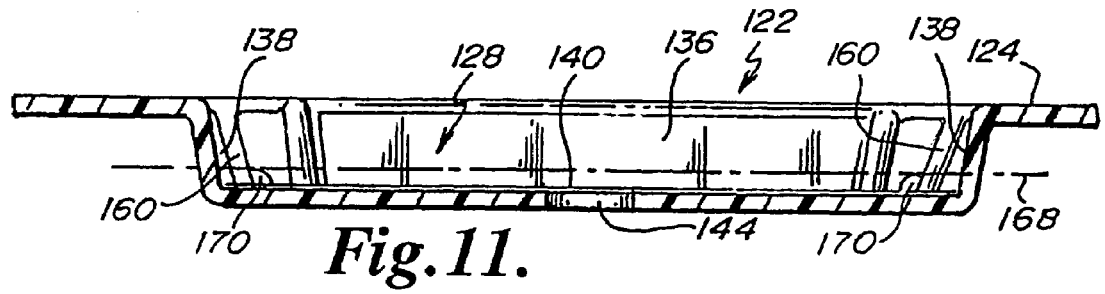
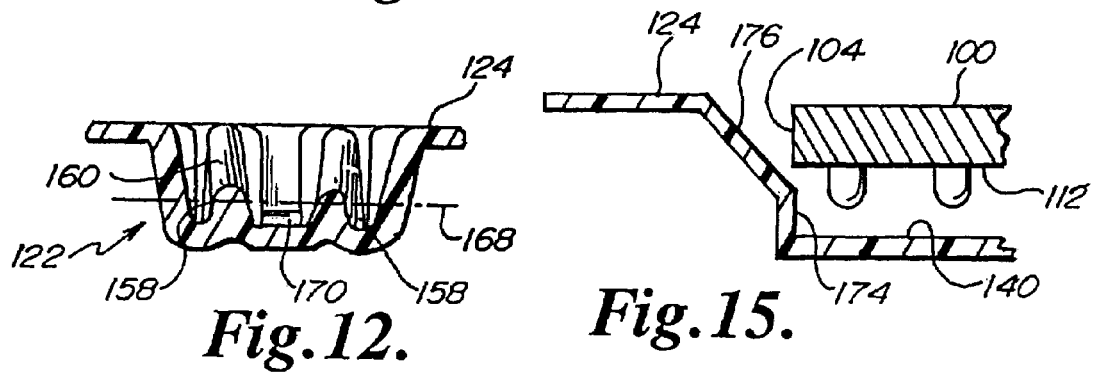
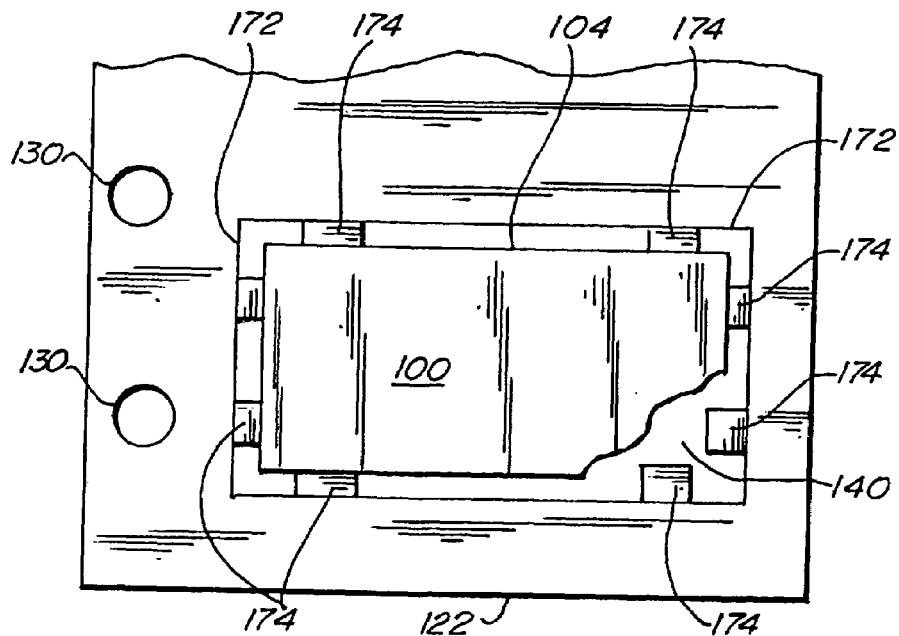

CARRIER TAPE FOR ELECTRONIC COMPONENTS

RELATED APPLICATIONS

The present application claims the benefit of U.S. Provisional Application No. 60/377,537 filed May 1, 2002, and herein incorporated by reference in its entirety.

FIELD OF THE INVENTION

This invention relates to component carrier tape, and more particularly to a component carrier tape having self-aligning pockets.

BACKGROUND OF THE INVENTION

Modern semi-conductors have grown to be extremely complex and are highly susceptible to damage from external influences, such as contaminants, mechanical shock, electrostatic discharges and physical contact. Accordingly, various types of carriers have been developed to protect the delicate semi-conductors as they are transported between the many process steps needed for production. Various types of carriers have been developed for this purpose and are known in the art, including matrix and chip trays designed to carry a batch of components, as well as carrier tapes which are designed to carry the components in a continuous fashion.

Integrated circuit components which must be properly handled and transported include pin grid array (PGA), bare die, bump die, non-radial chip scale packing, ball grid arrays (BGA), and other leadless chip packages. These packages typically have a square or rectangular periphery with a flat upper surface, a flat lower surface, and generally have a relatively thin planar housing. Four side surfaces extend around the rectangular periphery. A lower peripheral corner extends around the periphery at the inner section of the sidewalls and lower surface.

The BGA is currently a popular integrated circuit package. BGA integrated circuits are characterized by the thin planar housing and a plurality of external terminals on the lower surface of the housing. Each external terminal comprises a small solder ball. Like earlier pin grid array integrated circuit packages, the solder ball terminals in a BGA integrated circuit package can be arranged in a two-dimensional array. However, the terminal density in a BGA integrated circuit package is greater than attainable then with PGA integrated circuit packages.

When transporting BGA integrated circuit packages, it is important that the solder ball terminals of the package be prevented from contacting the surface of the carrier device to prevent damage to the BGA package. Tray type carriers have been developed to meet this need. For example, in U.S. Pat. No. 5,791,486 (Brahmbhatt), owned by the owners of the present invention and fully incorporated herein by reference, a tray for integrated circuit components is disclosed having a pocket design wherein the component is supported above the bottom of the pocket by the lower peripheral corner of the component, and wherein no portion of the component terminals are in contact with the surfaces of the tray.

What is still needed in the industry, however, is a carrier tape wherein a component can be supported within a pocket of the carrier tape with limited contact between the carrier tape and the component so that the terminals of the component are not in contact with the tape.

SUMMARY OF THE INVENTION

The present invention substantially meets the aforementioned needs of the industry. A carrier tape for storing and transporting integrated circuit components is formed from a strip of material in which pockets are formed for receiving an integrated circuit component. Pockets are generally square or rectangular and have a corner design allowing point support of the component at its lower peripheral corner and without contact of the device terminals with any surface within the pocket or of the tape.

The invention may also include a pocket design for a carrier tape, matrix tray or chip tray in which the pocket corners have self-aligning features as described in U.S. Pat. No. 5,791,486 and in which the corner is provided with a failsafe shelf for supporting a component at its corner if the component becomes misaligned or is upset within the pocket.

The invention thus includes a carrier tape for receiving and seating a plurality of components, each having an upper surface, a lower surface, four corners, and a periphery with four side surfaces transverse to and intersecting the lower surface at a lower peripheral corner extending around the component. The carrier tape includes a flexible body portion having a top surface. A plurality of pockets is formed in the flexible body portion, the pockets positioned for receiving and confining the component. Each pocket has an interior, four corners, and four sides, each of the corners having a corner guide including a pair of component contact portions positioned on an incline so that the component contact portions slope toward the interior of the pocket. Each component contact portion includes a guide-in portion, a component seating portion, and a subordinate portion below the seating portion. The incline is continuous through the guide-in portion, the seating portion, and the subordinate portion, whereby when the component is engaged with the seating portion, only the lower peripheral corner of the component is in contact with the body portion.

BRIEF DESCRIPTION OF THE DRAWINGS

FIG. 11 is a transverse sectional view of the embodiment of FIG. 7.

FIG. 12 is a sectional view of a pocket corner of the embodiment of FIG. 9.

FIG. 13 is a plan view of an embodiment of a carrier tape.

FIG. 15 is a close-up of the transverse sectional view of FIG. 14.

DETAILED DESCRIPTION OF THE PREFERRED EMBODIMENT

Figure 1:
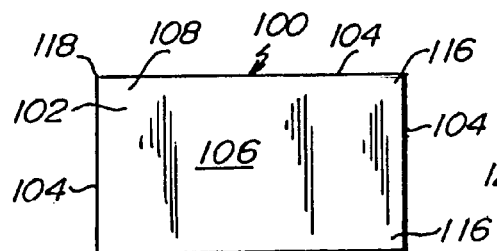
FIG. 1 is a plan view of an integrated circuit component.
Figure 2:
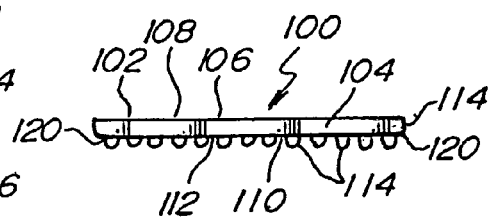
FIG. 2 is a side elevational view of the integrated circuit component of FIG. 1
Figure 6:
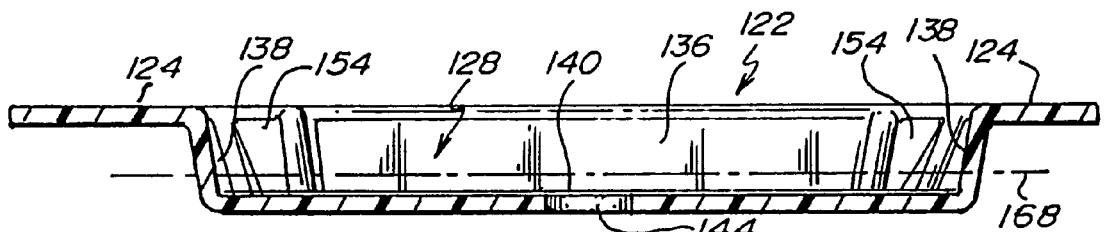
FIG. 6 is a transverse sectional view of the embodiment shown in FIG. 2.
Figure 3A:
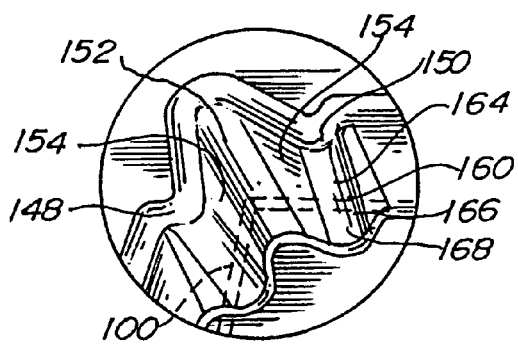
FIG. 3A is an enlarged view of the corner of the pocket depicted in FIG. 3.
Figure 8A:
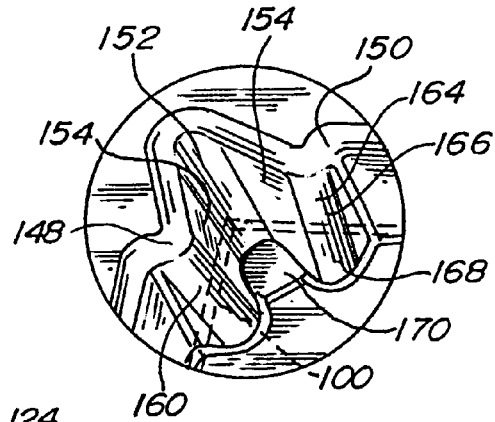
FIG. 8A is an enlarged view of the corner of the pocket depicted in FIG. 8.
Figure 7:
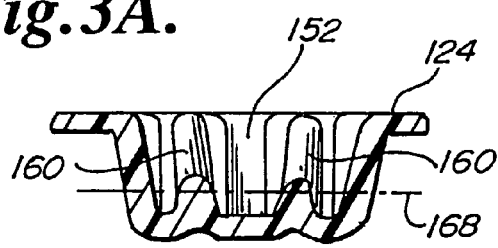
FIG. 7 is a sectional view of a pocket corner of the embodiment shown in FIG. 4.
Figure 3:
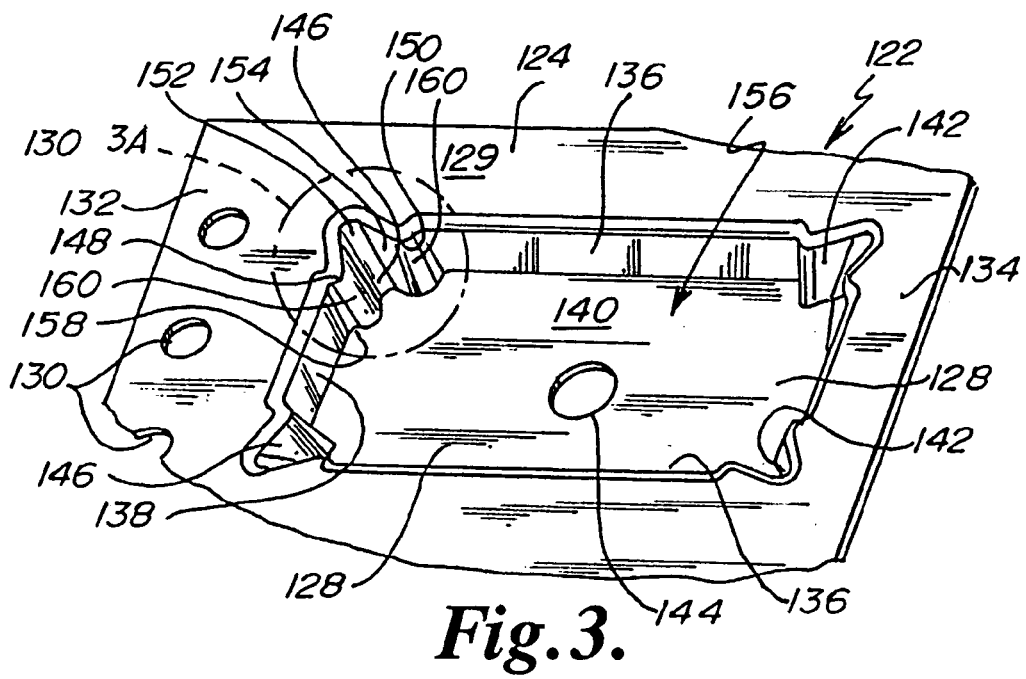
FIG. 3 is a perspective view of a single pocket of an embossed carrier tape according to the present invention.
Figure 4:
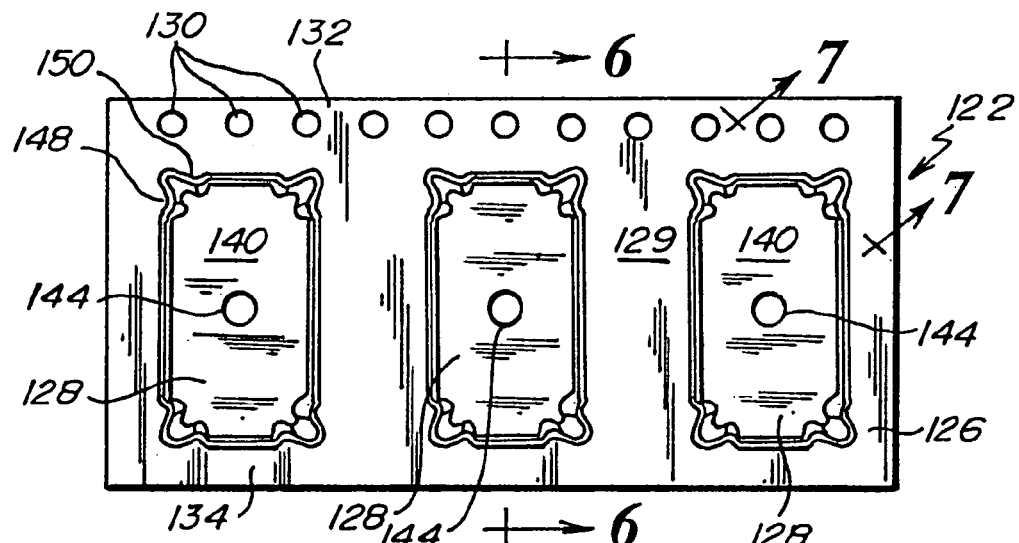
FIG. 4 is a top plan view of a section of the embossed carrier tape according to the present invention.
Figure 5:
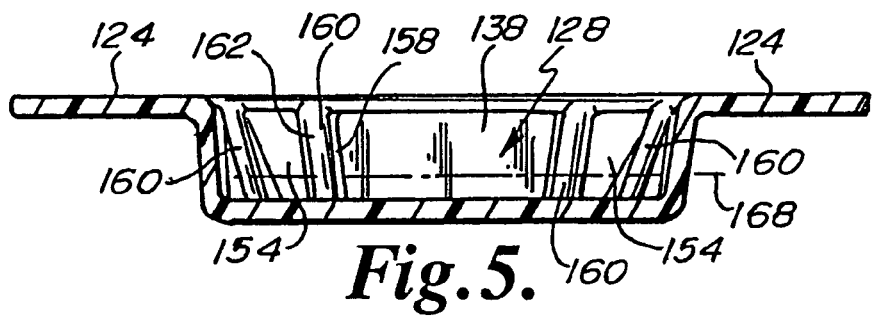
FIG. 5 is a longitudinal sectional view at the embodiment shown in FIG. 2.
Figure 8:
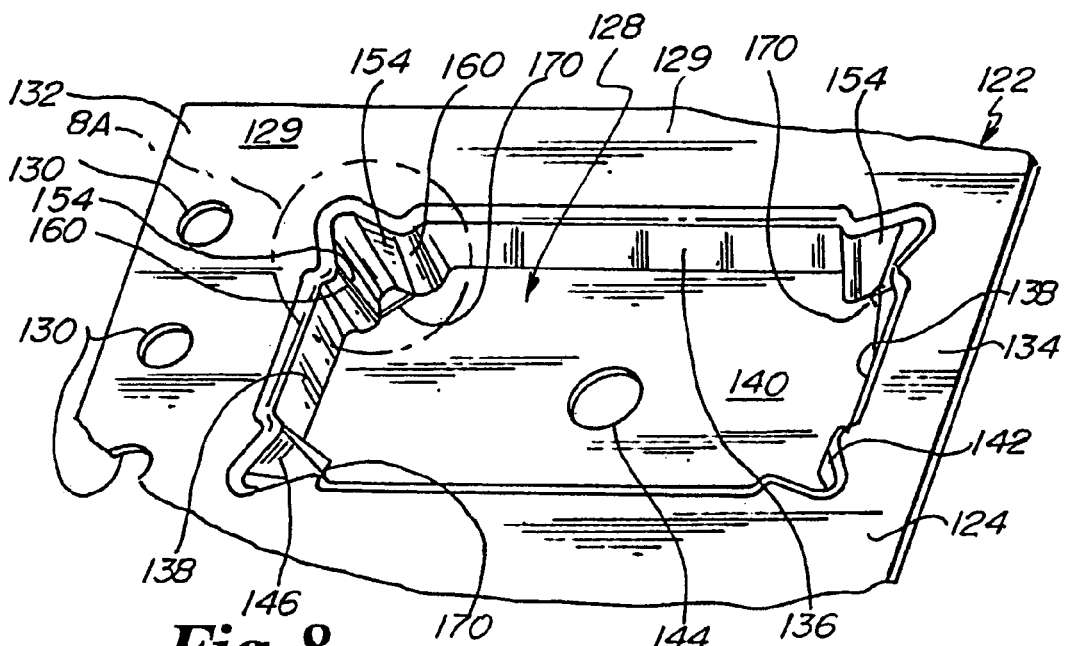
FIG. 8 is a perspective view of a single pocket of an alternative embodiment of the embossed carrier tape of the present invention.
Figure 9:
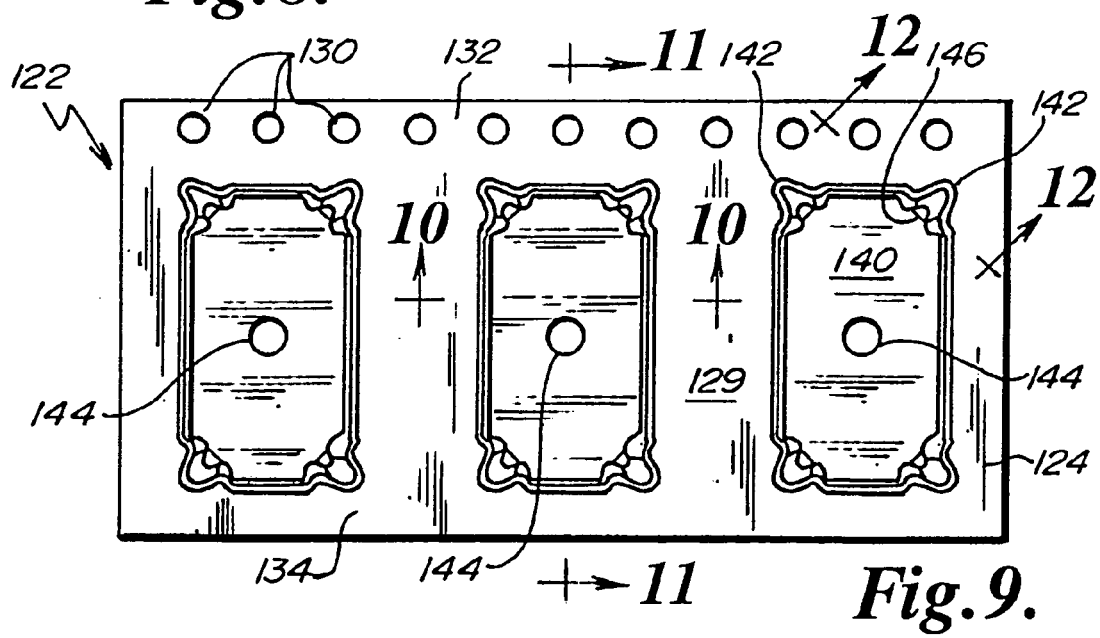
FIG. 9 is a top plane view of the embodiment of FIG. 6.

Depicted in FIGS. 1 and 2 is a component 100 in the form of a ball grid array (BGA) integrated circuit 102. Component 100 includes four side surfaces 104, an upper side 106 having an upper planar surface 108, and a bottom side 110 with a bottom planar surface 112. Bottom side 110 may include an array of terminals 114. Component 100 also has corners 116, each of which has a tip 118. A lower peripheral corner 120 is formed by the intersection of side surfaces 104 and bottom planar surface 112. Although component 100 is depicted herein as a BGA device, it will of course be appreciated that component 100 may also be any other similarly configured component such as a pin grade array (PGA), bare die, bump die, non-radial chip scale package, or other leadless chip package.

In FIGS. 3–7 is depicted a preferred embodiment of a carrier tape 122 of the present invention. Carrier tape 122 generally includes a flexible body 124 in the form of a long strip of material 126 in which device pockets 128 are arranged seriatim in a longitudinally oriented array. The tape has a top surface 129, and an opposing bottom surface (not depicted). Sprocket holes 130 are arranged along one or both lateral margins 132, 134, of carrier tape 122 to enable the tape to be moved by automated equipment.

Device pockets 128 are defined by a pair of opposing sidewalls 136, a pair of opposing end walls 138 and pocket bottom 140. Pocket corners 142, described further hereinbelow, may be substantially as described as in U.S. Pat. No. 5,791,486 (Brahmbhatt), and provide support for a component 100 disposed in the pocket 128 by contact with the lower peripheral corner 120 of the component. An aperture 144 may be provided in pocket bottom 140 to enable access with automated handling apparatus, or to enable the application of vacuum for holding a component 100 in the pocket 128.

In the embodiment of FIGS. 3–7, each pocket corner 142 includes a corner guide 146, which is V-shaped with two component engagement portions 148, 150, joined at a junction 152. Both the component engagement portions 148, 150, have an inner first face 154 facing the interior 156 of the pocket 128 and a second face 158 generally upright and intersecting the first face 154 at a ridge 160. The ridge 160 constitutes an inclined component contact portion 162 with a guide-in portion 164, a seating portion 166, and a subordinate portion 168 below the seating portion 166. The ridge 160 may be rounded as depicted.

The inner first faces 154 and second faces 158 thus cooperate to form an intersection shaped as a ridge 160 to support the lower peripheral corner 120 of the component 100 and to center the corner 116 between the component engagement portions 148, 150. More specifically, when the component 100 is placed in the pocket 128, the lower peripheral corner 120 will slide downwardly and inwardly along the ridges 160 of the component engagement portions 148, 150, until a point is reached at which further downward and inward motion of the lower peripheral corner 120 is prevented by the ridges 160. Because the inner faces 154, 158, have the same mirror image orientation relative to the pocket bottom 140, the corner 116 will come to rest centered between the component engagement portions 148, 150. Also, with the component at the seating portion 166, the tip 118 of the corner 116 will be separated from the junction 152 so that the component 100 does not touch the junction 152.

The component engagement portions 148, 150, extend or angle toward the adjacent pocket corner 142 as the ridge 160 slopes toward the top surface 129. Although ridge 160 is depicted as linear it may also be curved. The orientation of ridge 160 provides improved component seating beyond that of a ridge orientation directly perpendicular to the edge of the component. The ridges 160 angling toward the pocket corner 142 urge the component corner downward and into the corner 142 for proper seating.

Carrier tape 122 may be formed from any suitable polymer material. Currently it is most preferred that polystyrene material be used, and it is also currently most preferred that the material be carbon loaded to provide electrical conductivity and corresponding static electricity dissipation capability. Pockets 128 may be formed in carrier tape 122 by any suitable method. Currently it is most preferred that pockets 128 be embossed.

In operation, a component 100 may be disposed in each pocket 128 of carrier tape 122. When the component is disposed in the pocket 128 at the seating portion 166, the bottom planar surface 112 of the component 100 will be co-planar with a substrate plane 168 and any terminals 114 of the component 100 will be held spaced apart from pocket bottom 140. The component 100 contacts carrier tape 122 only at lower peripheral corner 120.

FIGS. 8–12 depict a currently most preferred embodiment of the carrier tape 122 according to the present invention. In this embodiment, pocket corners 142 are as described above with the addition of shelf 170. Shelf 170 serves as a failsafe support should a component 100 become misaligned or be upset while disposed in pocket 128.

Figure 10:
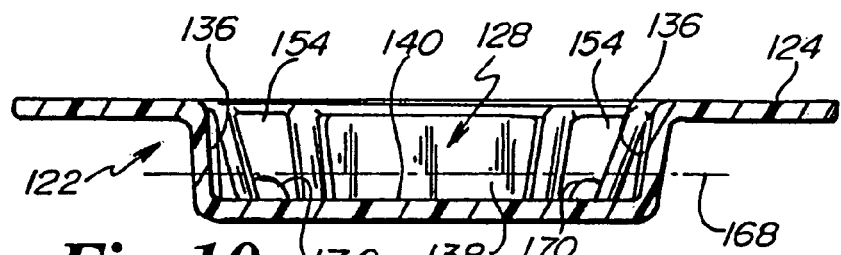
FIG. 10 is a longitudinal sectional view of the embodiment of FIG. 7.
Figure 14:
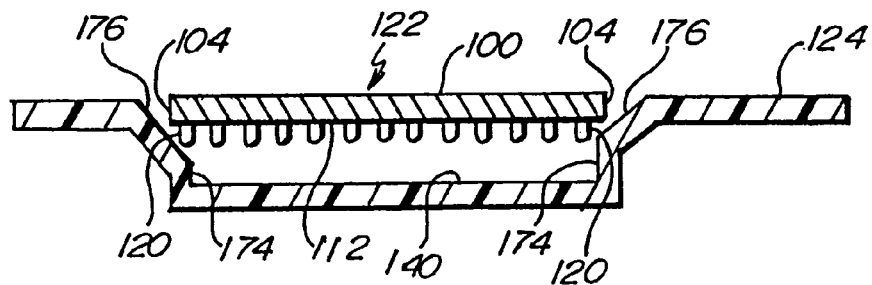
FIG. 14 is a transverse sectional view of the embodiment of FIG. 13.

In normal operation, the bottom surface of a component disposed in pocket 128 is co-planar with substrate plane 168 as previously described and as depicted in FIGS. 10–12. In this position, the bottom planar surface 112 of component 100 is not in contact with shelf 170. If component 100 should become slightly misaligned in pocket 128, however, one or more corners 116 of component 100 will contact shelf 170 preventing further downward movement of the integrated circuit component 100 while still holding terminals 114 away from contact with pocket bottom 140.

Shelf 170 may be used with any of the carrier tape pocket embodiments described herein. In addition, it will be readily appreciated that shelf 170 may be incorporated in any of the pocket corner arrangements of U.S. Pat. No. 5,791,486, previously incorporated by reference herein. Thus, the failsafe feature provided by shelf 170 described above may be provided in other types of carriers, such as matrix trays and chip trays.

Alternative embodiments of carrier tape 122 are depicted in FIGS. 13–16. In one embodiment shown in FIG. 13-15, carrier tape 122 includes pocket corners 172. On both sides of pocket corner 172 is a component engagement member 174. Typically, component engagement member 174 comprises an angled component contact surface 176 angled toward pocket bottom 140. When component 100 is properly seated within pocket 128, side surface 104 is generally parallel to a projecting engagement member surface 178 while bottom planar surface 112 is generally parallel to pocket bottom 140.

Figure 16:
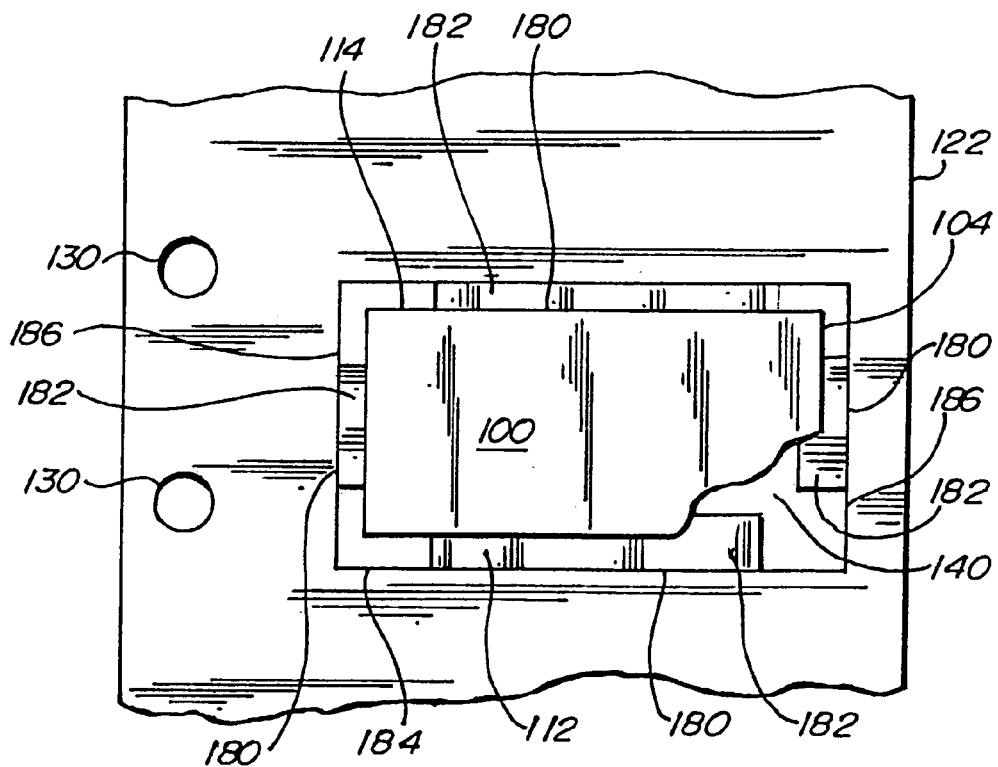
FIG. 16 is a plan view of an alternative embodiment of a carrier tape.

An embodiment of carrier tape 122 including alternative component engagement members 180 is depicted in FIG. 16. Component engagement members 180 include an angled component contact surface 182 angled toward pocket bottom 140. Component engagement members 180 extend along a substantial portion of opposing sidewalls 184 and opposing end walls 186. When integrated circuit component 100 is properly positioned within pocket 128, lower peripheral corner 120 rests on rests evenly on angled component contact surface 182 such that bottom planar surface 112 is generally parallel to pocket bottom 140.

The present invention may be embodied in other specific forms without departing from the spirit of the essential attributes thereof; therefore, the illustrated embodiments should be considered in all respects as illustrative and not restrictive.

What is claimed is:

1. The combination of a plurality of components and a carrier tape for receiving and seating the components, each component having an upper surface, a lower surface, four corners, and a periphery with four side surfaces, the four side surfaces transverse to and intersecting the lower surface at a lower peripheral corner extending around said component, the carrier tape comprising:

a flexible body portion having a top surface and presenting a longitudinal axis, and a plurality of pockets spaced apart along the longitudinal axis of said flexible body portion, each pocket for receiving and confining a separate one of the components, the pockets each having four sides, four corners, and a bottom, each of said corners including a corner guide portion comprising a pair of spaced apart generally v-shaped component contact ridges positioned on an incline so that the component contact ridges slope downwardly away from the closest adjacent corner and toward the bottom of the pocket, each component contact ridge including a guide-in portion, a component seating portion, and a subordinate portion below the seating portion, said incline continuous through the guide-in portion, the seating portion, and the subordinate portion, so that when the component is received in the pocket, the lower peripheral corner of the component is engaged with the seating portion of each component contact ridge at substantially a single point of contact with no other portions of the component in contact with the carrier tape, and the lower surface of the component is spaced apart from the bottom of the pocket.

2. The combination of claim 1, wherein each component contact ridge is formed by the intersection of an upright first face and an upright second face.

3. The combination of claim 2, wherein each second face is generally transverse to the pocket side and said first face is intermediate said second face and the closest corner.

4. The combination of claim 1 wherein the corner guide portion includes a support shelf, said shelf extending from the incline and sloping toward the interior of the pocket, whereby upon misalignment of the component, the component will contact the shelf so as to prevent further downward movement of the component.

5. The combination of a plurality of components and a carrier tape for receiving the components, each component having an upper surface, a lower surface, and a plurality of side surfaces defining a periphery, each side surface intersecting the lower surface at a lower peripheral corner extending around said component, the carrier tape comprising:

a flexible body portion having a top surface with a plurality of pockets formed therein, each pocket for receiving a separate one of the plurality of components and comprising a plurality of sides and a bottom defining a recess with a plurality of corners, each corner of the pocket including means for engaging the lower peripheral corner of the component at a pair of contact points spaced apart along the lower peripheral corner of the component so that the component is supported thereon and so that no other portion of the component is engaged with the carrier tape when the component is disposed in the pocket.

6. The combination of claim 5 wherein said means includes a plurality of component contact ridges, each of the component contact ridges positioned on an incline so as to slope downwardly from the top surface away from the closest adjacent corner and toward the bottom of the pocket.

7. The combination of claim 6 wherein at least one of the corners includes a support shelf positioned so as to contact the component upon misalignment of the component and thereby prevent further downward movement of the component in the pocket.

8. The combination of claim 6, wherein the pockets each have four corners and four sides, each of the corners having a corner guide including a pair of component contact ridges, each component contact ridge including a guide-in portion, a component seating portion, and a subordinate portion below the seating portion, said incline continuous through the guide-in portion, the seating portion, and the subordinate portion.

9. The combination of claim 8, wherein each component contact ridge is formed by the intersection of an upright first face and an upright second face.

10. The combination of claim 9, wherein each second face is generally transverse to the pocket side and said first face is intermediate said second face and the closest corner.

11. The combination of a plurality of components and a carrier tape for receiving the components, each component having a generally planar lower surface and a plurality of side surfaces positioned transverse to and intersecting the lower surface at a lower peripheral corner extending around the component, the lower surface of the component having a plurality of projecting terminals, the carrier tape comprising an elongate flexible plastic body portion having a top surface with a plurality of spaced apart pockets defined therein, each pocket for receiving a separate one of the plurality of components and comprising a plurality of sides and a bottom defining a recess with a plurality of corners, each corner including at least one generally v-shaped component contact ridge positioned on an incline so as to slope downwardly away from the closest adjacent corner and toward the bottom of the pocket, each component contact ridge disposed to engage and support the lower peripheral corner of the component at substantially a single point of contact when the component is received in the pocket so that no other portion of the component is engaged with the carrier tape and so that the terminals are spaced apart from the bottom of the pocket.

12. The combination of claim 11 wherein at least one of the corners of the pocket includes a support shelf positioned so as to contact the component upon misalignment of the component and thereby prevent further downward movement of the component in the pocket.

13. The combination of claim 11, wherein each component contact ridge is formed by the intersection of an upright first face and an upright second face.

14. The combination of claim 13, wherein each second face is generally transverse to the pocket side and said first face is intermediate said second face and the closest corner.

* * * * *